(12) United States Patent
Choi

(10) Patent No.: US 11,658,205 B2
(45) Date of Patent: May 23, 2023

(54) ELECTROLUMINESCENT DISPLAY DEVICE

(71) Applicant: LG Display Co., Ltd., Seoul (KR)

(72) Inventor: Jeong-Mook Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 248 days.

(21) Appl. No.: 17/115,526

(22) Filed: Dec. 8, 2020

(65) Prior Publication Data

US 2021/0175281 A1    Jun. 10, 2021

(30) Foreign Application Priority Data

Dec. 9, 2019   (KR) .......................... 10-2019-0162802

(51) Int. Cl.
  *H01L 27/15*   (2006.01)
  *H01L 33/62*   (2010.01)
  *H01L 33/38*   (2010.01)

(52) U.S. Cl.
  CPC ............ *H01L 27/156* (2013.01); *H01L 33/38* (2013.01); *H01L 33/62* (2013.01)

(58) Field of Classification Search
  CPC combination set(s) only.
  See application file for complete search history.

(56) References Cited

U.S. PATENT DOCUMENTS

| 2012/0313509 | A1* | 12/2012 | Takagi | H05B 33/10 313/504 |
| 2015/0311261 | A1* | 10/2015 | Choi | H01L 27/3276 257/40 |
| 2016/0172422 | A1* | 6/2016 | Kim | H01L 27/322 438/34 |
| 2020/0194518 | A1* | 6/2020 | Myung | H01L 27/3223 |

\* cited by examiner

*Primary Examiner* — Mark W Tornow
*Assistant Examiner* — Priya M Rampersaud
(74) *Attorney, Agent, or Firm* — Fenwick & West LLP

(57) ABSTRACT

An electroluminescent display device includes a substrate on which a display area and a non-display area are defined, a plurality of sub-pixels disposed in the display area on the substrate and arranged along a first direction and a second direction, a light-emitting diode disposed at each of the plurality of sub-pixels and including a first electrode, a light-emitting layer and a second electrode, a first bank disposed between adjacent sub-pixels arranged along the second direction and overlapping edges of the first electrode, and a second bank disposed between adjacent sub-pixels arranged along the first direction and having an opening corresponding to a row of the sub-pixels arranged along the second direction, wherein the opening includes a first portion corresponding to the display area and a second portion corresponding to the non-display area, and a width of the second portion is narrower than a width of the first portion.

15 Claims, 11 Drawing Sheets

ELECTROLUMINESCENT DISPLAY DEVICE

CROSS-REFERENCE TO RELATED APPLICATIONS

The present application claims priority from and the benefit under 35 U.S.C § 119(a) of Republic of Korea Patent Application No. 10-2019-0162802 filed on Dec. 9, 2019, which is hereby incorporated by reference in its entirety.

BACKGROUND

Field of the Disclosure

The present disclosure relates to an electroluminescent display device, and more particularly, to an electroluminescent display device having a large size and high definition.

Discussion of the Related Art

As one of flat panel display devices, an electroluminescent display device has wide viewing angles as compared with a liquid crystal display device because it is self-luminous and also has advantages of a thin thickness, light weight and low power consumption because a backlight unit is not necessary.

In addition, the electroluminescent display device is driven by low voltages of direct current (DC) and has a fast response time. Further, the electroluminescent display device is strong against the external impacts and is used in a wide range of temperatures because its components are solids, and particularly, the electroluminescent display device can be manufactured at low costs.

The electroluminescent display device includes a plurality of pixels, each of which has red, green and blue sub-pixels, and displays various color images by allowing the red, green and blue sub-pixels to selectively emit light.

The red, green and blue sub-pixels have red, green and blue light-emitting layers, respectively, and each light-emitting layer is formed through a vacuum thermal evaporation process in which a luminous material is selectively deposited using a fine metal mask (FMM).

However, the evaporation process increases manufacturing costs due to preparation of the mask and has a problem in application to a large-sized and high-definition display device due to manufacturing variations, sagging, shadow effect of the mask, and the like.

SUMMARY

Accordingly, the present disclosure is directed to an electroluminescent display device that substantially obviates one or more of the problems due to limitations and disadvantages of the related art.

An object of the present disclosure is to provide an electroluminescent display device having a large size and high definition.

Additional features and advantages of the present disclosure will be set forth in the description which follows, and in part will be apparent from the description, or can be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided an electroluminescent display device that includes a substrate on which a display area displaying an image and a non-display area disposed outside the display area are defined, a plurality of sub-pixels disposed in the display area on the substrate and arranged along a first direction and a second direction, a light-emitting diode disposed at each of the plurality of sub-pixels and including a first electrode, a light-emitting layer and a second electrode, a first bank disposed between adjacent sub-pixels arranged along the second direction and overlapping edges of the first electrode, and a second bank disposed between adjacent sub-pixels arranged along the first direction and having an opening corresponding to a row of the sub-pixels arranged along the second direction, wherein the opening includes a first portion corresponding to the display area and a second portion corresponding to the non-display area, and a width of the second portion is narrower than a width of the first portion.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate an embodiment of the present disclosure and together with the description serve to explain the principles of the present disclosure.

DETAILED DESCRIPTION

Reference will now be made in detail to exemplary embodiments of the disclosure, examples of which are illustrated in the accompanying drawings.

An electroluminescent display device according to an embodiment of the present disclosure includes a plurality of pixels to display an image, and each of the plurality of pixels includes red, green and blue sub-pixels. A pixel region corresponding to each sub-pixel can have a configuration shown in FIG. 1.

Figure 1:
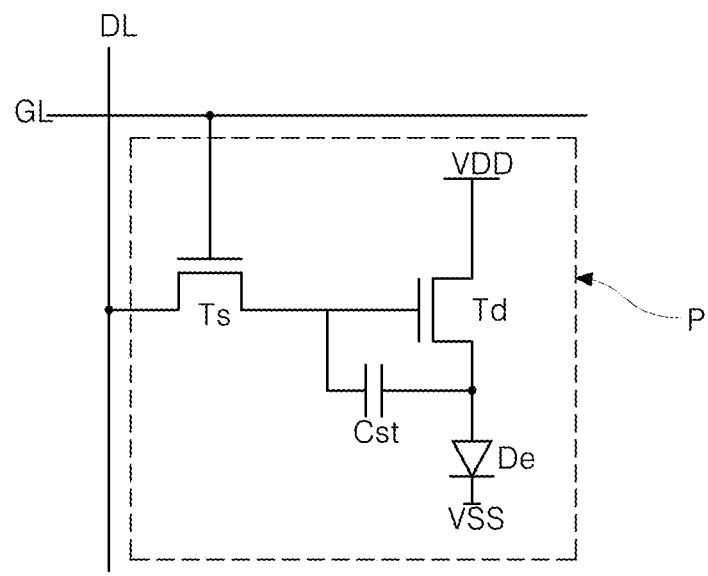
FIG. 1 is a circuit diagram of one pixel region of an electroluminescent display device according to an embodiment of the present disclosure.

FIG. 1 is a circuit diagram of one pixel region of an electroluminescent display device according to an embodiment of the present disclosure.

In FIG. 1, the electroluminescent display device according to the embodiment of the present disclosure includes a plurality of gate lines and a plurality of data lines crossing each other to define a plurality of pixel regions. Particularly, in the example of FIG. 1, a gate line GL and a data line DL cross each other to define a pixel region P. A switching thin film transistor Ts, a driving thin film transistor Td, a storage capacitor Cst, and a light-emitting diode De are formed in each pixel region P.

More specifically, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts and a source electrode of the driving thin film transistor Td is connected to a high voltage supply VDD. An anode of the light-emitting diode De is connected to a drain electrode of the driving thin film transistor Td, and a cathode of the light-emitting diode De is connected to a low voltage supply VSS. The storage capacitor Cst is connected to the gate electrode and the drain electrode of the driving thin film transistor Td.

The electroluminescent display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts.

When the driving thin film transistor Td is turned on by the data signal, an electric current flowing through the light-emitting diode De is controlled, thereby displaying an image. The light-emitting diode De emits light due to the current supplied through the driving thin film transistor Td from the high voltage supply VDD.

Namely, the amount of the current flowing through the light-emitting diode De is proportional to the magnitude of the data signal, and the intensity of light emitted by the light-emitting diode De is proportional to the amount of the current flowing through the light-emitting diode De. Thus, the pixel regions P show different gray levels depending on the magnitude of the data signal, and as a result, the electroluminescent display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light-emitting diode De to be constant and the gray level shown by the light-emitting diode De to be maintained until a next frame.

Meanwhile, one or more thin film transistors and/or capacitors can be added in the pixel region P in addition to the switching and driving thin film transistors Ts and Td and the storage capacitor Cst.

For example, in the electroluminescent display device, the driving thin film transistor Td is turned on for a relatively long time while the data signal is applied to the gate electrode of the driving thin film transistor Td and the light-emitting diode De emits light to thereby display the gray level. The driving thin film transistor Td can deteriorate due to application of the data signal for a long time. Therefore, the mobility and/or threshold voltage Vth of the driving thin film transistor Td are changed, and thus the pixel region P of the electroluminescent display device displays a different gray level with respect to the same data signal. This causes non-uniform luminance, thereby lowering the image quality of the electroluminescent display device.

Accordingly, to compensate the change of the mobility and/or threshold voltage of the driving thin film transistor Td, at least one sensing thin film transistor and/or capacitor for sensing a voltage change can be further added in the pixel region P. The sensing thin film transistor and/or capacitor can be connected to a reference line for applying a reference voltage and outputting a sensing voltage.

Figure 2:
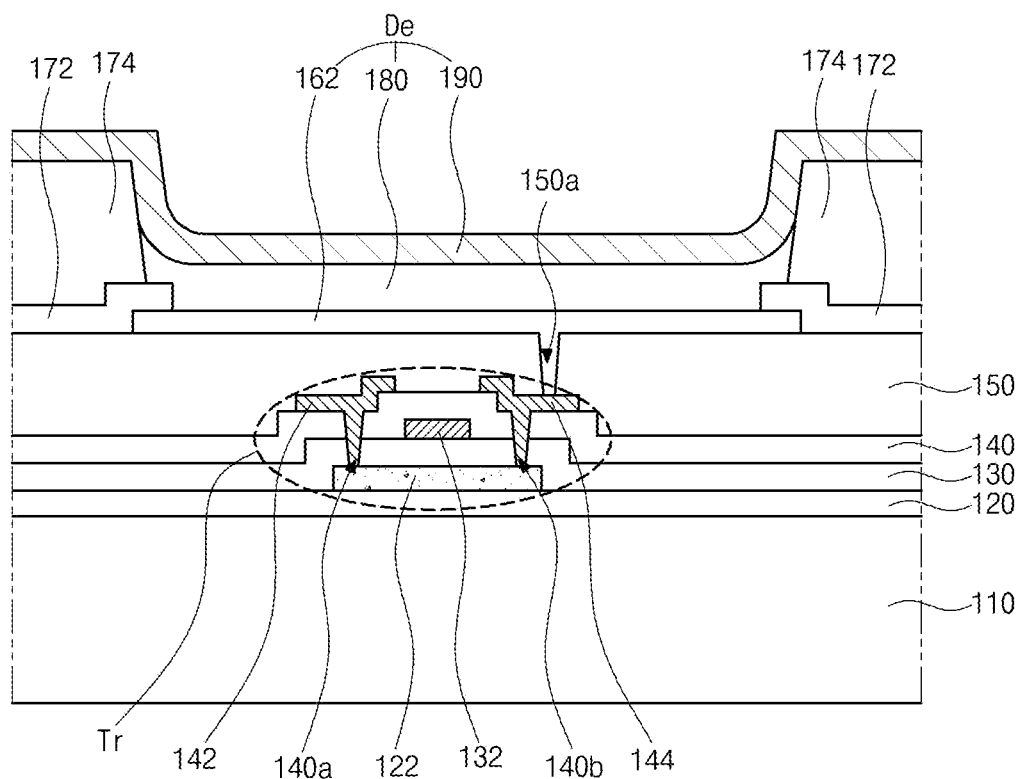
FIG. 2 is a schematic cross-sectional of an electroluminescent display device according to the embodiment of the present disclosure.

FIG. 2 is a schematic cross-sectional of an electroluminescent display device according to the embodiment of the present disclosure and shows one pixel region.

In the electroluminescent display device of FIG. 2, a buffer layer 120 is formed on a substrate 110. The buffer layer 120 is disposed substantially on an entire surface of the substrate 110. The substrate 110 can be a glass substrate or a plastic substrate. For example, polyimide can be used as the plastic substrate, but is not limited thereto. The buffer layer 120 can be formed of an inorganic material, such as silicon oxide ($SiO_2$) or silicon nitride (SiNx), and can be a single layer or multiple layers.

A patterned semiconductor layer 122 is formed on the buffer layer 120. The semiconductor layer 122 can be formed of an oxide semiconductor layer, and a light-shielding pattern can be further formed under the semiconductor layer 122. The light-shielding pattern can block light incident on the semiconductor layer 122 and can prevent the semiconductor layer 122 from deteriorating due to the light. Alternatively, the semiconductor layer 122 can be formed of polycrystalline silicon, and both ends of the semiconductor layer 122 can be doped with impurities.

A gate insulation layer 130 of an insulating material is formed on the semiconductor layer 122 substantially over the entire surface of the substrate 110. The gate insulation layer 130 can be formed of an inorganic insulating material such as silicon oxide ($SiO_2$) or silicon nitride (SiNx). When the semiconductor layer 122 is made of an oxide semiconductor material, the gate insulation layer 130 can be formed of silicon oxide ($SiO_2$). Alternatively, when the semiconductor layer 122 is made of polycrystalline silicon, the gate insulation layer 130 can be formed of silicon oxide ($SiO_2$) or silicon nitride (SiNx).

A gate electrode 132 of a conductive material such as metal is formed on the gate insulation layer 130 corresponding to the center of the semiconductor layer 122. In addition, a gate line and a first capacitor electrode can be formed on the gate insulation layer 130. The gate line extends in a first direction, and the first capacitor electrode is connected to the gate electrode 132.

In the embodiment of the present disclosure, the gate insulation layer 130 is formed over the entire surface of the substrate 110. However, the gate insulation layer 130 can be patterned to have the same shape as the gate electrode 132.

An interlayer insulation layer 140 made of an insulating material is formed on the gate electrode 132 substantially over the entire surface of the substrate 110. The interlayer insulation layer 140 can be formed of an inorganic insulating material such as silicon oxide ($SiO_2$) or silicon nitride (SiNx). Alternatively, the interlayer insulation layer 140 can be formed of an organic insulating material such as photo acryl or benzocyclobutene.

The interlayer insulation layer 140 has first and second contact holes 140a and 140b exposing top surfaces of both ends of the semiconductor layer 122. The first and second contact holes 140a and 140b are disposed at both sides of the gate electrode 132 and spaced apart from the gate electrode 132. The first and second contact holes 140a and 140b are also formed in the gate insulation layer 130. Alternatively, when the gate insulation layer 130 is patterned to have the same shape as the gate electrode 132, the first and second contact holes 140a and 140b are formed only in the interlayer insulation layer 140.

Source and drain electrodes 142 and 144 of a conductive material such as metal are formed on the interlayer insulation layer 140. In addition, a data line, a power supply line and a second capacitor electrode can be further formed on the interlayer insulation layer 140.

The source and drain electrodes 142 and 144 are spaced apart from each other with the gate electrode 132 positioned therebetween and are in contact with both ends of the semiconductor layer 122 through the first and second contact holes 140a and 140b, respectively. The data line extends in a second direction and crosses the gate line to thereby define a pixel region. The power supply line for supplying a high voltage is spaced apart from the data line. The second capacitor electrode is connected to the drain electrode 144. The second capacitor electrode overlaps the first capacitor electrode to thereby constitute a storage capacitor with the interlayer insulation layer 140 therebetween as a dielectric. Alternatively, the first capacitor electrode can be connected to the drain electrode 144, and the second capacitor electrode can be connected to the gate electrode 132.

The semiconductor layer 122, the gate electrode 132, and the source and drain electrodes 142 and 144 form a thin film transistor Tr. The thin film transistor Tr has a coplanar structure in which the gate electrode 132 and the source and drain electrodes 142 and 144 are located at the same side with respect to the semiconductor layer 122.

Alternatively, the thin film transistor Tr can have an inverted staggered structure in which the gate electrode and the source and drain electrodes are located at different sides with respect to the semiconductor layer. That is, the gate electrode can be disposed under the semiconductor layer, and the source and drain electrodes can be disposed over the semiconductor layer. The semiconductor layer can be formed of oxide semiconductor or amorphous silicon.

The thin film transistor Tr corresponds to a driving thin film transistor Td of FIG. 1, and a switching thin film transistor Ts of FIG. 1 having the same structure as the driving thin film transistor Tr can be further formed in the pixel region on the substrate 110. The gate electrode 132 of the driving thin film transistor Tr can be connected to a drain electrode of the switching thin film transistor, and the source electrode 142 of the driving thin film transistor Tr is connected to the power supply line. In addition, a gate electrode and a source electrode of the switching thin film transistor can be connected to the gate line and the data line, respectively.

A sensing thin film transistor having the same structure of the driving thin film transistor Tr can be further formed in the pixel region on the substrate 110, but the present disclosure is not limited thereto.

An overcoat layer 150 of an insulating material is formed on the source and drain electrodes 142 and 144 substantially over the entire surface of the substrate 110. The overcoat layer 150 can be formed of an organic insulating material such as photo acryl or benzocyclobutene. The overcoat layer 150 can have a flat top surface.

Meanwhile, an insulation layer of an inorganic insulating material such as silicon oxide ($SiO_2$) or silicon nitride (SiNx) can be further formed under the overcoat layer 150, that is, between the thin film transistor Tr and the overcoat layer 150.

The overcoat layer 150 has a drain contact hole 150a exposing the drain electrode 144. The drain contact hole 150a can be spaced apart from the second contact hole 140b. Alternatively, the drain contact hole 150a can be disposed right over the second contact hole 140b.

A first electrode 162 is formed on the overcoat layer 150 and formed of a conductive material having a relatively high work function. The first electrode 162 is disposed in the pixel region and is in contact with the drain electrode 144 through the drain contact hole 150a. For example, the first electrode 162 can be formed of a transparent conductive material such as indium tin oxide (ITO) or indium zinc oxide (IZO), but is not limited thereto.

The electroluminescent display device according to the embodiment of the present disclosure is a top emission type in which light of a light-emitting diode De is output toward a direction opposite the substrate 110. Accordingly, the first electrode 162 can further include a reflective electrode or a reflective layer formed of a metal material having a relatively high reflectance below the transparent conductive material. For example, the reflective electrode or reflective layer can be formed of an aluminum-palladium-copper (APC) alloy, silver (Ag) or aluminum (Al). The first electrode 162 can have a triple-layer structure of ITO/APC/ITO, ITO/Ag/ITO or ITO/Al/ITO, but is not limited thereto.

A bank of an insulating material is formed on the first electrode 162. The bank can include a first bank 172 of a hydrophilic property and a second bank 174 of a hydrophobic property.

More particularly, the first bank 172 overlaps and covers edges of the first electrode 162 and exposes a central portion of the first electrode 162. The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

The second bank 174 is formed on the first bank 172. At this time, at least an upper surface of the second bank 174 is hydrophobic, and a side surface of the second bank 174 can be hydrophobic or hydrophilic.

The second bank 174 has a narrower width than the first bank 172, is disposed on the first bank 172, and exposes edges of the first bank 172. A thickness of the second bank 174 can be greater than a thickness of the first bank 172. The second bank 174 can overlap the edges of the first electrode 162. Alternatively, the second bank 174 can be spaced apart from the first electrode 162 without an overlap.

The second bank 174 can be formed of an organic insulating material having a hydrophobic property. Alternatively, the second bank 174 can be formed of an organic insulating material having a hydrophilic property and can be subjected to a hydrophobic treatment.

Meanwhile, only the first bank 172 can be disposed on other edges of the first electrode 162 not shown in the figure. In addition, even if the first and second banks 172 and 174 are formed on the edges of the first electrode 162 in FIG. 2, the first bank 172 can be omitted, and only the second bank 174 can overlap and cover the edges of the first electrode 162.

In FIG. 2, the first bank 172 and the second bank 174 are separately formed of different materials. However, the hydrophilic first bank 172 and the hydrophobic second bank 174 can be formed of the same material and formed as one body. For example, after an organic material layer having an upper surface of a hydrophobic can be formed substantially over the entire surface of the substrate 110, the organic material layer can be exposed to light using a halftone mask, which includes a light-transmitting portion, a light-blocking portion and a half light-transmitting portion, and can be patterned, thereby forming the first bank 172 and the second bank 174 having different widths and thicknesses.

In addition, the drain contact hole 150a is spaced apart from the first and second banks 172 and 174, but is not limited thereto. Alternatively, the drain contact hole 150a can be disposed right under the first and second banks 172 and 174.

Next, a light-emitting layer 180 is formed on the first electrode 162 exposed by the first and second banks 172 and 174.

The light-emitting layer 180 can include a first charge auxiliary layer, a light-emitting material layer, and a second charge auxiliary layer that are sequentially positioned over the first electrode 162. The light-emitting material layer can be formed of any one of red, green and blue luminescent materials, but is not limited thereto. The luminescent material can be an organic luminescent material such as a phosphorescent compound or a fluorescent compound or can be an inorganic luminescent material such as a quantum dot.

The first charge auxiliary layer can be a hole auxiliary layer, and the hole auxiliary layer can include at least one of a hole injecting layer (HIL) and a hole transporting layer (HTL). In addition, the second charge auxiliary layer can be an electron auxiliary layer, and the electron auxiliary layer can include at least one of an electron injecting layer (EIL) and an electron transporting layer (ETL). However, the present disclosure is not limited thereto.

The light-emitting layer 180 is formed through a solution process. Thus, the process can be simplified and a display device with a large size and high resolution can be provided. A spin coating method, an ink jet printing method, or a screen printing method can be used as the solution process, but the present disclosure is not limited thereto.

When the solution is dried, a drying speed of a solvent in a region adjacent to the second bank 174 is different from that in other regions. That is, the drying speed of the solvent in the region adjacent to the second bank 174 is faster than that in the other regions. Therefore, a height of the light-emitting layer 180 in the region adjacent to the second bank 174 can rise as it gets closer to the second bank 174.

Meanwhile, among the layers of the light-emitting layer 180, the electron auxiliary layer can be formed through a thermal evaporation process. At this time, the electron auxiliary layer can be formed substantially over the entire surface of the substrate 110.

A second electrode 190 of a conductive material having a relatively low work function is formed on the light-emitting layer 180 substantially over the entire surface of the substrate 110. The second electrode 190 can be formed of aluminum (Al), magnesium (Mg), silver (Ag), or an alloy thereof. The second electrode 190 has a relatively thin thickness such that light from the light-emitting layer 180 can be transmitted therethrough. Alternatively, the second electrode 190 can be formed of a transparent conductive material such as indium-gallium-oxide (IGO), but is not limited thereto.

The first electrode 162, the light-emitting layer 180 and the second electrode 190 constitute a light-emitting diode De. The first electrode 162 can serve as an anode, and the second electrode 190 can serve as a cathode, but is not limited thereto.

As described above, the electroluminescent display device according to the embodiment of the present disclosure can be a top emission type in which light from the light-emitting layer 180 of the light-emitting diode De is output toward a direction opposite the substrate 110, that is, output to the outside through the second electrode 190. The top emission type display device can have a wider emission area than a bottom emission type display device of the same size, to thereby improve luminance and reduce power consumption.

The light-emitting diode De of each pixel region can have an element thickness for a micro-cavity effect corresponding to a wavelength of the emitted light, thereby increasing the light efficiency. Here, the element thickness can be defined as a distance between the first electrode 162 and the second electrode 190, but is not limited thereto.

In addition, a protective layer and/or an encapsulating layer can be formed on the second electrode 190 substantially over the entire surface of the substrate 110 to block moisture or oxygen introduced from the outside, thereby protecting the light-emitting diode De.

As described above, in the electroluminescent display device according to the embodiment of the present disclosure, by forming some of the light-emitting layer 180 through the solution process, a fine metal mask is omitted to thereby reduce the manufacturing costs, and a display device with a large size and high definition can be implemented.

By the way, when the light-emitting layer 180 is formed through the solution process, the solution is dropped in each of a plurality of sub-pixels at a time, and to do this, different nozzles are used for respective sub-pixels. However, a variation in the thickness of a thin film formed in each sub-pixel occurs due to a deviation in the dropping amounts of the nozzles. Accordingly, in the present disclosure, the light-emitting layers 180 of the same color sub-pixels are connected to each other to thereby form one body. Thus, the deviation in the dropping amounts of the nozzles is minimized, and thicknesses of the light-emitting layers 180 formed in the respective sub-pixels can be uniform.

The configuration of the electroluminescent display device according to the embodiment of the present disclosure will be described with reference to FIG. 3.

Figure 3:
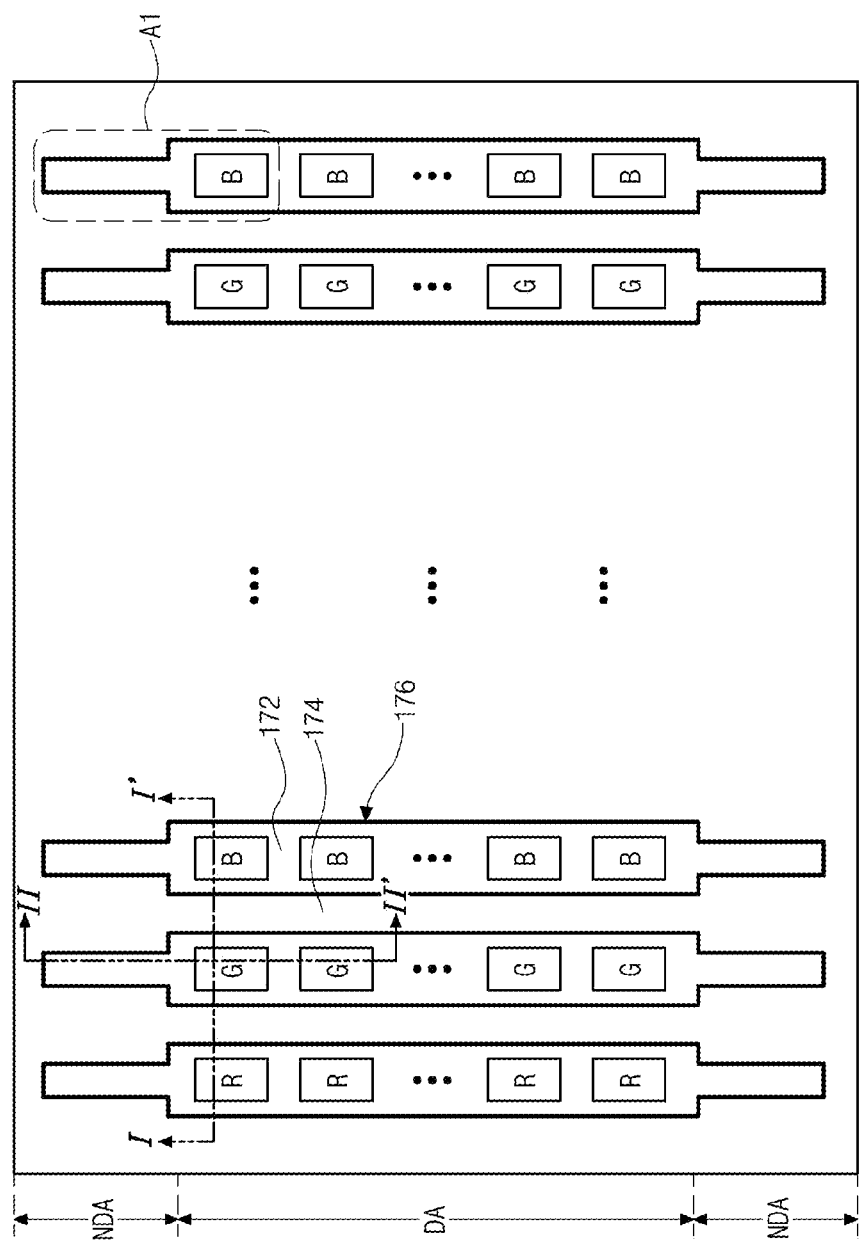
FIG. 3 is a schematic plan view of an electroluminescent display device according to the embodiment of the present disclosure.

FIG. 3 is a schematic plan view of an electroluminescent display device according to the embodiment of the present disclosure and mainly shows a bank configuration.

In FIG. 3, the electroluminescent display device according to the embodiment of the present disclosure includes a display area DA displaying an image and a non-display area NDA disposed outside the display area DA. Here, the non-display area NDA is illustrated to be disposed up and down the display area DA, but is not limited thereto. Alternatively, the non-display area NDA can be disposed left and right the display area DA.

In the display area DA, red, green and blue sub-pixels R, G and B are disposed. The red, green and blue sub-pixels R, G and B are sequentially arranged along a first direction, and the same color sub-pixels R, G and B are arranged along a second direction. For example, R, G and B sub-pixels are repeatedly arranged in that order along the first direction (e.g., horizontal direction), whereas a row of R sub-pixels, a row of G sub-pixels, and a row of B sub-pixels are repeatedly arranged in that order along the second direction (e.g., vertical direction). Here, the red, green and blue sub-pixels R, G and B are shown to each have a rectangular shape, but is not limited thereto. The red, green and blue sub-pixels R, G and B each can have various shapes such as a rectangular shape with rounded corners, an oval shape, or the like.

A first bank 172 of a hydrophilic property is disposed between adjacent same color sub-pixels R, G and B and between adjacent different color sub-pixels R, G and B. Alternatively, the first bank 172 can be omitted between the adjacent different color sub-pixels R, G and B. That is, the first bank 172 can be formed between the adjacent sub-pixels R, G and B arranged along the second direction and can extend along the first direction.

In addition, the first bank 172 is also disposed in the non-display area NDA and can be formed to enclose all the sub-pixels R, G and B.

A second bank 174 of a hydrophobic property is disposed on the first bank 172. In the display area DA, the second bank 174 has an opening 176 corresponding to a same color sub-pixel column and is disposed between adjacent different color sub-pixels R, G and B. Accordingly, the opening 176 extends in the second direction, and the opening 176 has a length of the second direction greater than a length of the first direction, i.e., a width. In other words, the opening 176 has a short side parallel to the first direction and a long side parallel to the second direction. At this time, the second bank 174 can have a narrower width than the first bank 172 between adjacent different color sub-pixels R, G and B.

In addition, the second bank 174 is also disposed in the non-display area NDA, and the opening 176 of the second bank 174 extends into the non-display area NDA. Here, the opening 176 has different widths in the display area DA and the non-display area NDA, and this will be described in detail later.

Meanwhile, although not shown in the figure, a plurality of dummy sub-pixels can be provided in the non-display area NDA, and the opening 176 of the second bank 174 can be formed to correspond to the dummy sub-pixels. At this time, one or more dummy sub-pixels can be disposed at each of upper and lower sides of each sub-pixel row. The dummy sub-pixels can have the same configuration as the red, green and blue sub-pixels R, G and B except for a connection structure. Alternatively, the dummy sub-pixels can have different configuration from the red, green and blue sub-pixels R, G and B.

A cross-sectional structure of the electroluminescent display device according to the embodiment of the present disclosure will be described with reference to FIG. 4 and FIG. 5.

Figure 4:
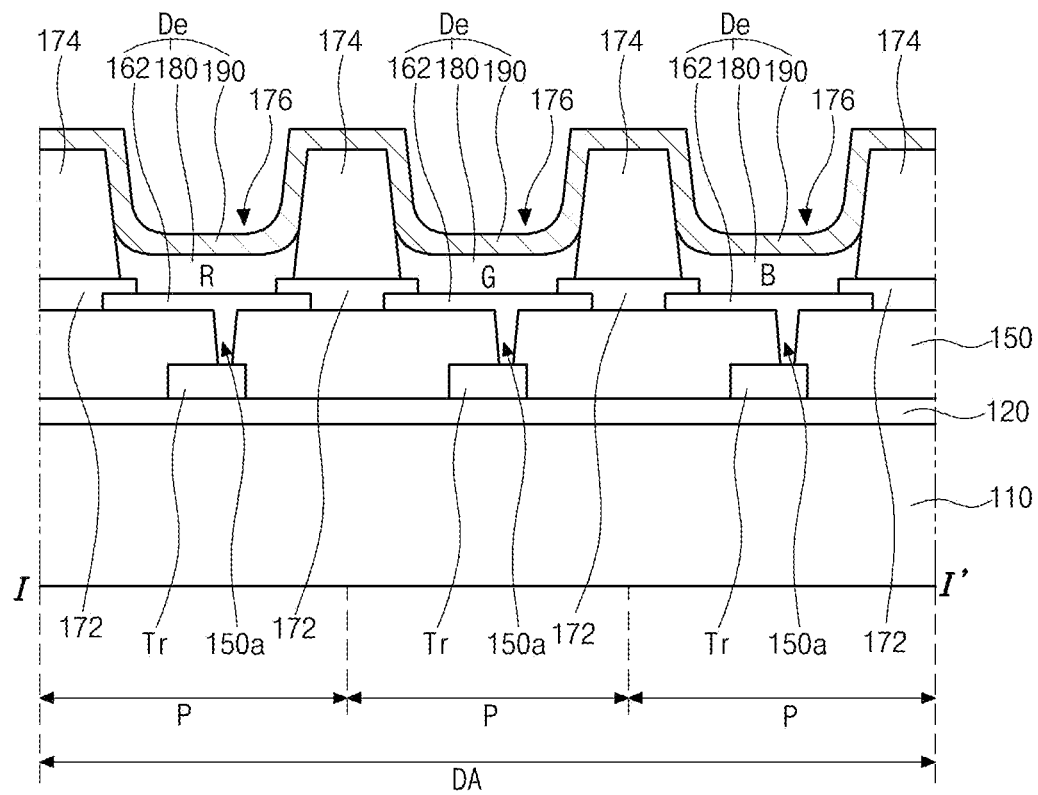
FIG. 4 is a cross-sectional view corresponding to the line I-I' of FIG. 3 according to an embodiment of the present disclosure.
Figure 5:
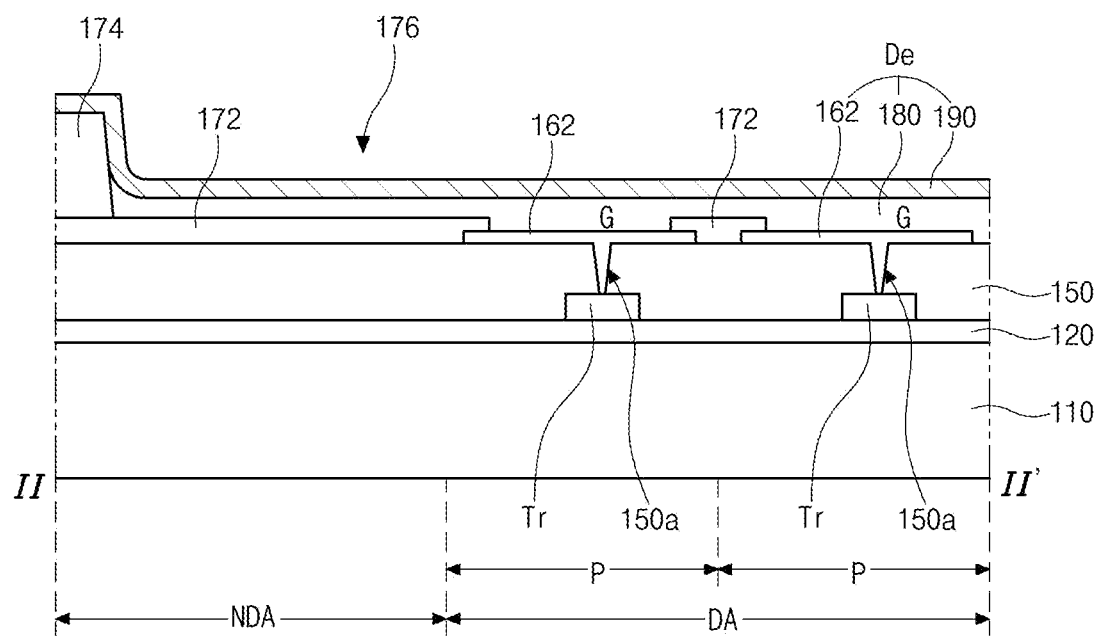
FIG. 5 is a cross-sectional view corresponding to the line II-II' of FIG. 3 according to an embodiment of the present disclosure.

FIG. 4 is a cross-sectional view corresponding to the line I-I' of FIG. 3, and FIG. 5 is a cross-sectional view corresponding to the line II-II' of FIG. 3 according to embodiments of the present disclosure.

As shown in FIG. 4 and FIG. 5, a display area DA and a non-display area NDA are defined on a substrate 110, and a plurality of pixel regions P respectively corresponding to red, green and blue sub-pixels R, G and B are defined in the display area DA. A buffer layer 120 is formed substantially on an entire surface of the substrate 110, and the buffer layer 120 is disposed in both the display area DA and the non-display area NDA.

A thin film transistors Tr is formed on the buffer layer 120 in each pixel region P. An overcoat layer 150 is formed on the thin film transistor Tr substantially over the entire surface of the substrate 110, and the overcoat layer 150 is disposed in both the display area DA and the non-display area NDA. Next, a first electrode 162 is formed on the overcoat layer 150 in each pixel region P.

Here, the thin film transistor Tr can have the configuration shown in FIG. 2, but is not limited thereto. In addition, although not shown in the figure, a gate insulation layer and an interlayer insulation layer can be further formed between the buffer layer 120 and the overcoat layer 150, and an inorganic insulation layer can be further formed between the thin film transistor Tr and the overcoat layer 150.

In each pixel region P, the overcoat layer 150 has a drain contact hole 150a exposing a part of the thin film transistor Tr, that is, a drain electrode. The first electrode 162 contacts the drain electrode of the thin film transistor Tr through the drain contact hole 150a.

On the other hand, when the dummy sub-pixels are provided in the non-display area NDA, a dummy thin film transistor having the same configuration as the thin film transistor Tr of the pixel region P can be formed between the buffer layer 120 and the overcoat layer 150 in each dummy sub-pixel, and a dummy electrode can be formed on the overcoat layer 150 in each dummy sub-pixel. Here, the overcoat layer 150 does not have a drain contact hole exposing the dummy thin film transistor in the dummy sub-pixel, and thus the dummy electrode is not connected to the dummy thin film transistor in the dummy sub-pixel.

However, the configuration of the dummy sub-pixel is not limited thereto. For example, at least one of the dummy thin film transistor and the dummy electrode can be omitted.

A first bank 172 of a hydrophilic property is formed on the first electrode 162. The first bank 172 overlaps and covers edges of the first electrode 162. The first bank 172 is formed between adjacent same color sub-pixels R, G and B and between adjacent different color sub-pixels R, G and B. Alternatively, the first bank 172 can be omitted between adjacent different color sub-pixels R, G and B and can be disposed only between adjacent same color sub-pixels R, G and B.

In addition, the first bank 172 can be formed substantially all over the non-display area NDA. Alternatively, the first bank 172 can be removed in the non-display area NDA.

Meanwhile, when the dummy sub-pixel is provided in the non-display area NDA, the first bank 172 can overlap and cover edges of the dummy electrode and expose a central portion of the dummy electrode.

The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

A second bank 174 of a hydrophobic property is formed on the first bank 172. The second bank 174 has a thicker thickness than the first bank 172. The second bank 174 is formed only between adjacent different color sub-pixels R, G and B and is not formed between adjacent same color sub-pixels R, G and B. A width of the second bank 174 is narrower than a width of the first bank 172 between adjacent different color sub-pixels R, G and B.

The second bank 174 has an opening 176 corresponding to a same color sub-pixel column and exposes the first electrodes 162 of the same color sub-pixel column and the first bank 172 between adjacent first electrodes 162 through the opening 176. In addition, the opening 176 extends into the non-display area NDA.

Here, when the first bank 172 is omitted between adjacent different color sub-pixels R, G and B, the second bank 174 contacts and overlaps edges of each first electrode 162 of FIG. 4 and covers the edges of each first electrode 162 of FIG. 4.

The second bank 174 can be formed of an organic insulating material having a hydrophobic property. Alternatively, the second bank 174 can be formed of an organic insulating material having a hydrophilic property and can be subjected to a hydrophobic treatment.

The first bank 172 and the second bank 174 can be formed of the same material and formed as one body. At this time, the first bank 172 and the second bank 174 can be formed through a half-tone mask process.

A light-emitting layer 180 is formed on the first electrode 162 exposed through the opening 176 of the second bank 174 in each pixel region P. Here, a red light-emitting layer is formed in the red sub-pixel R, a green light-emitting layer is formed in the green sub-pixel G, and a blue light-emitting layer is formed in the blue sub-pixel B.

In addition, the light-emitting layer 180 is also formed on the first bank 172 exposed through the opening 176 of the second bank 174 between adjacent same color sub-pixels R, G and B. Namely, in FIG. 5, the green light-emitting layer 180 is also formed on the first bank 172 exposed through the opening 176 of the second bank 174 between adjacent green sub-pixels G. At this time, the light-emitting layer 180 on the first bank 172 is connected to the light-emitting layer 180 on the first electrode 162 in each pixel region P adjacent thereto to thereby form one body.

Meanwhile, as described above, the opening 176 of the second bank 174 extends into the non-display area NDA, and thus, the light-emitting layer 180 is also formed in the non-display area NDA. The light-emitting layer 180 of the non-display area NDA is connected to the light-emitting layer 180 of the pixel region P of the display area DA to thereby form one body. At this time, the opening 176 of the second bank 174 exposes the first bank 172 of the non-display area NDA, and the light-emitting layer 180 is formed on the first bank 172 of the non-display area NDA.

Alternatively, the first bank 172 can be removed in the non-display area NDA. In this case, the opening 176 of the second bank 174 can expose the overcoat layer 150 of the non-display area NDA, and the light-emitting layer 180 can be formed on the overcoat layer 150 of the non-display area NDA.

The light-emitting layer 180 is formed through a solution process. Here, the solutions dropped into respective pixel regions P corresponding to the same color sub-pixels, for example, the green sub-pixel column, through different nozzles are connected to each other, and the light-emitting layer 180 is formed by drying the solutions. Accordingly, a deviation in the dropping amounts between the nozzles is minimized, and thicknesses of the light-emitting layers 180 formed in the respective pixel regions P can be uniform.

At this time, since the opening 176 of the second bank 174 has a narrower width in the non-display area NDA than in the display area DA, the solution dropped in the opening 176 can be prevented from being concentrated into the center of the display area DA due to a capillary phenomenon.

Next, a second electrode 190 is formed on the light-emitting layer 180 and the second bank 174. Here, the second electrode 190 is also formed on a top surface and a side surface of the second bank 174 and is in contact with the top surface and the side surface of the second bank 174.

The first electrode 162, the light-emitting layer 180 and the second electrode 190 constitute a light-emitting diode De.

As described above, in the electroluminescent display device according to the first embodiment of the present disclosure, the light-emitting layers 180 of the same color sub-pixels R, G and B are connected to each other and formed as one body, thereby reducing or minimizing the deviation in the dropping amounts between the nozzles and uniformly forming the thicknesses of the light-emitting layers 180 of the sub-pixels R, G and B. Therefore, the mura can be prevented, thereby preventing the image quality of the display device from being lowered.

In addition, the width of the opening 176 of the second bank 174 corresponding to the non-display area NDA is configured to be narrower than the width of the opening 176 of the second bank 174 corresponding to the display area DA. Accordingly, it can be prevented due to a capillary phenomenon that the solution dropped in the opening 176 is concentrated into the center of the display area DA, thereby preventing the problem that the light-emitting layer 180 is not formed in the pixel regions P disposed at both ends of the same color sub-pixel column.

The configuration of the opening according to the embodiment of the present disclosure will be described in detail with reference to the accompanying drawings.

Figure 6:
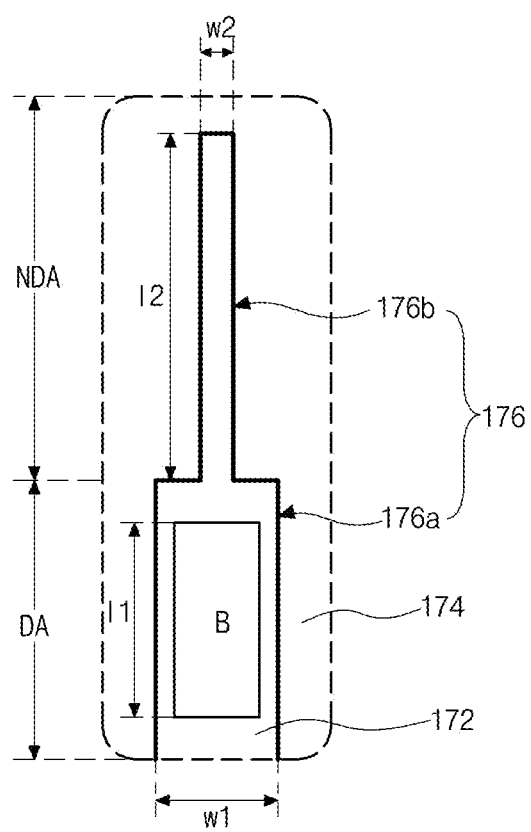
FIG. 6 is a schematically enlarged plan view of the electroluminescent display device according to a first embodiment of the present disclosure.

FIG. 6 is a schematically enlarged plan view of the electroluminescent display device according to a first embodiment of the present disclosure and shows the region A1 of FIG. 3.

In FIG. 6, the display area DA and the non-display area NDA are defined, and the first bank 172 of the hydrophilic property is formed to surround each sub-pixel B of the display area DA. Alternatively, the first bank 172 can be disposed only at upper and lower sides of the each sub-pixel B.

In addition, the first bank 172 is formed substantially all over the non-display area NDA. Alternatively, the first bank 172 can be removed in the non-display area NDA.

The second bank 174 of the hydrophobic property is formed on the first bank 172. The second bank 174 has the opening 176 corresponding to the same color sub-pixel column.

The opening 176 includes a first portion 176a disposed in the display area DA and a second portion 176b disposed in the non-display area NDA.

The first portion 176a has a first width w1 along the first direction, and the second portion 176b has a second width w2 along the first direction. The second width w2 is narrower than the first width w1.

Further, each sub-pixel B has a first length l1 along the second direction, and the second portion 176b of the opening 176 has a second length l2 along the second direction. The second length l2 is longer than the first length l1. Here, the second length l2 can be 10 times or less of the first length l1, and beneficially, the second length l2 can be 5 times or more and 10 times or less the first length l1.

For example, the second width w2 can be less than 55 μm, and the second length l2 can be 1 mm or more. However, the present disclosure is not limited thereto.

As described above, in the electroluminescent display device according to the first embodiment of the present disclosure, since the second width w2 of the second portion 176b of the opening 176 is narrower than the first width w1 of the first portion 176a, it can be prevented due to the capillary phenomenon that the solution dropped in the opening 176 is concentrated into the center of the display area DA.

Meanwhile, the second portion 176b of the opening 176 can include at least one uneven pattern at a side surface thereof, thereby further preventing that the solution dropped in the opening 176 is concentrated into the center of the display area DA.

The configuration of the opening including the uneven pattern according to other embodiments will be described in detail with reference to FIGS. 7 to 11B. Here, the same parts as that of the first embodiment are designated by the same reference signs, and explanation for the same parts will be shortened or omitted.

Figure 7:
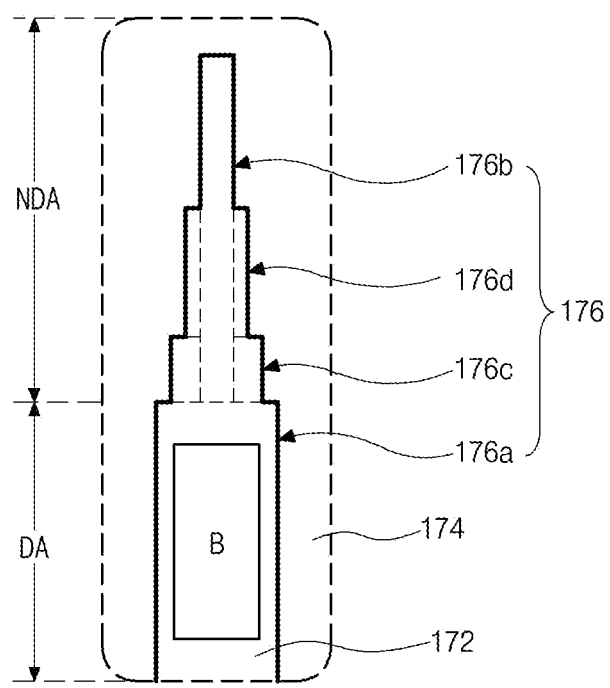
FIG. 7 is a schematically enlarged plan view of an electroluminescent display device according to a second embodiment of the present disclosure.

FIG. 7 is a schematically enlarged plan view of an electroluminescent display device according to a second embodiment of the present disclosure.

In FIG. 7, the second bank 174 has the opening 176 corresponding to the same color sub-pixel column, and the opening 176 includes the first portion 176a corresponding to the display area DA and the second portion 176b corresponding to the non-display area NDA.

The second portion 176b has the narrower width than the first portion 176a. Accordingly, the solution dropped in the opening 176 can be prevented from being concentrated into the center of the display area DA due to the capillary phenomenon.

Meanwhile, the second portion 176b has first and second uneven patterns 176c and 176d at each of first and second side surfaces facing each other along the first direction. The first uneven pattern 176c is disposed between the first portion 176a and the second uneven pattern 176d and is connected to the first portion 176a and the second uneven pattern 176d. In addition, the second portion 176b includes a portion without an uneven pattern, and the second uneven pattern 176d is disposed between the portion without an uneven pattern and the first uneven pattern 176c.

A width of the first uneven pattern 176c is wider than a width of the second uneven pattern 176d. Accordingly, the width of the second portion 176b decreases as it gets far from the first portion 176a.

Further, a length of the second uneven pattern 176d can be longer than a length of the first uneven pattern 176c and shorter than the portion without an uneven pattern, but is not limited thereto.

As compared with the first embodiment, since the first and second uneven patterns 176c and 176d increase a contact area between the solution and the second bank 174, adhesion and frictional force between the solution and the second bank 174 increase. Accordingly, it can be further prevented that the solution dropped in the opening 176 is concentrated into the center of the display area DA.

Figure 8A:
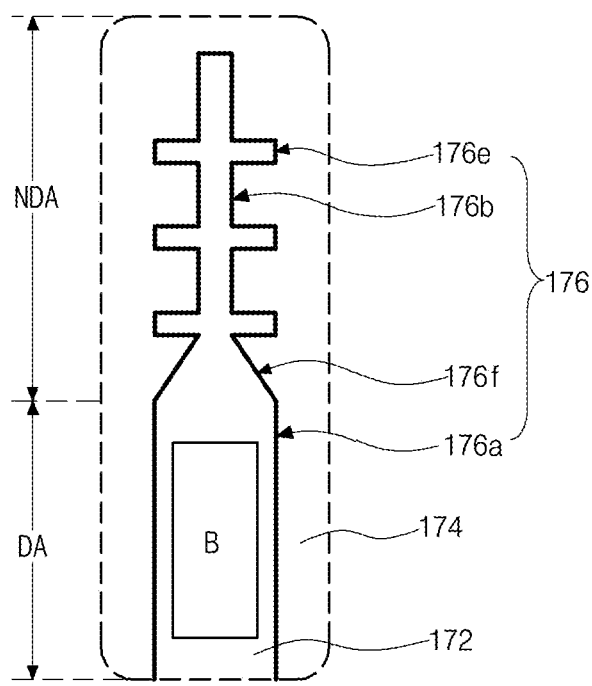
FIGS. 8A and 8B are schematically enlarged plan views of an electroluminescent display device according to a third embodiment of the present disclosure.
Figure 8B:
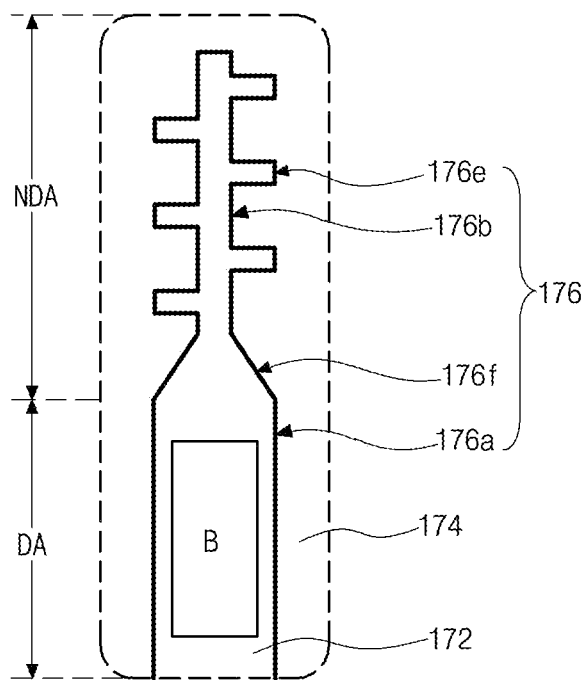

FIGS. 8A and 8B are schematically enlarged plan views of an electroluminescent display device according to a third embodiment of the present disclosure.

In FIGS. 8A and 8B, the second bank 174 has the opening 176 corresponding to the same color sub-pixel column, and the opening 176 includes the first portion 176a corresponding to the display area DA and the second portion 176b corresponding to the non-display area NDA.

The second portion 176b has the narrower width than the first portion 176a. Accordingly, the solution dropped in the opening 176 can be prevented from being concentrated into the center of the display area DA due to the capillary phenomenon.

Meanwhile, the second portion 176b has a plurality of uneven patterns 176e at each of first and second side surfaces facing each other along the first direction. Each of the uneven patterns 176e can be a protrusion having a rectangular shape.

As shown in FIG. 8A, the uneven patterns 176e can be disposed symmetrically to each other at the first and second side surface of the second portion 176b. Alternatively, as shown in FIG. 8B, the uneven patterns 176e can be disposed asymmetrically at the first and second side surface of the second portion 176b. That is, the uneven patterns 176e at the first side surface of the second portion 176b can alternate with the uneven patterns 176e at the second side surface of the second portion 176b.

The uneven patterns 176e can have the same size and the same distance therebetween. Alternatively, at least one of the size and the distance of the uneven patterns 176e can vary as it gets far from the first portion 176a. For example, the size of the uneven patterns 176e can increase as it gets far from the first portion 176a, and the distance between the uneven patterns 176e can decrease as it gets far from the first portion 176a.

The uneven patterns 176e increase the contact area between the solution and the second bank 174 to thereby increase the adhesion and the friction force between the solution and the second bank 174 as compared with the first embodiment, and thus it can be further prevented that the solution dropped in the opening 176 is concentrated into the center of the display area DA.

Meanwhile, a third portion 176f can be further disposed between the first portion 176a and the second portion 176b of the opening 176. The third portion 176f has a width that decreases from the first portion 176a to the second portion 176b. That is, the width of the third portion 176f adjacent to the first portion 176a is wider than the width of the third portion 176f adjacent to the second portion 176b. The third portion 176f can prevent the problem that the wetting property of the solution to the second bank 174 is lowered due to a sudden change between the widths of the first portion 176a and the second portion 176b.

Here, it is illustrated that corners of the uneven patterns 176e are angulated. However, the corners of the uneven patterns 176e can be rounded or curved, and in this case, the wetting property of the solution to the second bank 174 can be further improved.

Figure 9A:
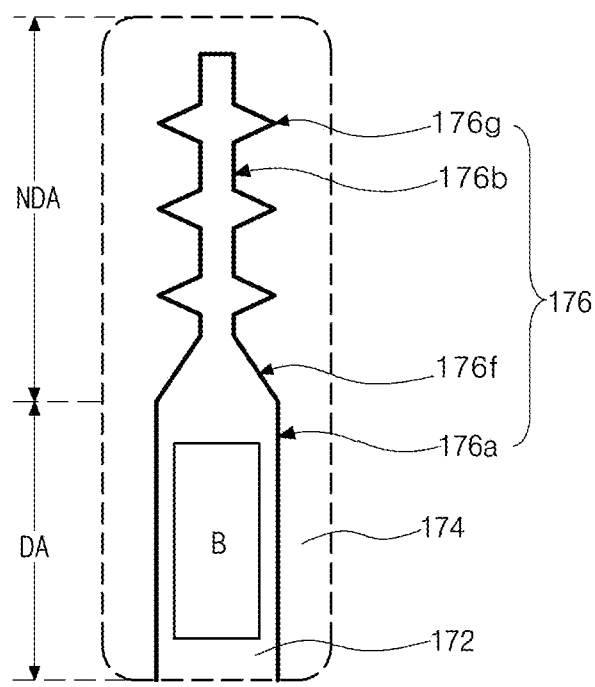
FIGS. 9A and 9B are schematically enlarged plan views of an electroluminescent display device according to a fourth embodiment of the present disclosure.
Figure 9B:
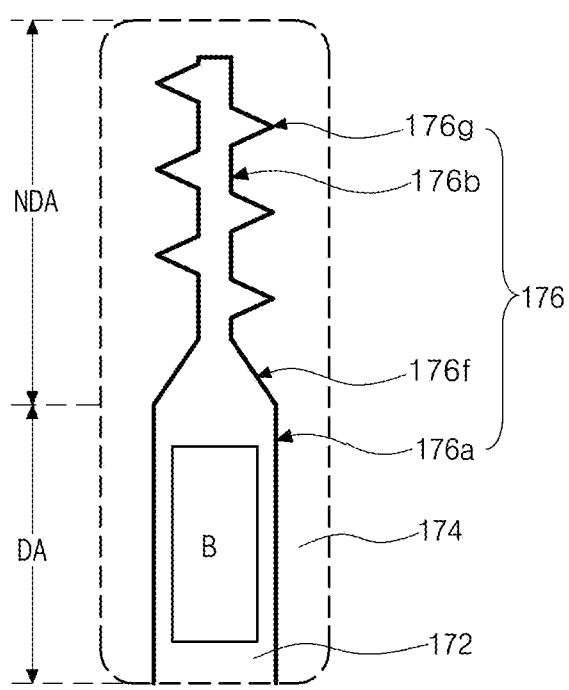

FIGS. 9A and 9B are schematically enlarged plan views of an electroluminescent display device according to a fourth embodiment of the present disclosure.

In FIGS. 9A and 9B, the second bank 174 has the opening 176 corresponding to the same color sub-pixel column, and the opening 176 includes the first portion 176a corresponding to the display area DA and the second portion 176b corresponding to the non-display area NDA.

The second portion 176b has the narrower width than the first portion 176a. Accordingly, the solution dropped in the opening 176 can be prevented from being concentrated into the center of the display area DA due to the capillary phenomenon.

Meanwhile, the second portion 176b has a plurality of uneven patterns 176g at each of first and second side surfaces facing each other along the first direction. Each of the uneven patterns 176g can be a protrusion having a triangular shape.

As shown in FIG. 9A, the uneven patterns 176g can be disposed symmetrically to each other at the first and second side surface of the second portion 176b. Alternatively, as shown in FIG. 9B, the uneven patterns 176g can be disposed asymmetrically at the first and second side surface of the second portion 176b. That is, the uneven patterns 176g at the first side surface of the second portion 176b can alternate with the uneven patterns 176g at the second side surface of the second portion 176b.

The uneven patterns 176g can have the same size and the same distance therebetween. Alternatively, at least one of the size and the distance of the uneven patterns 176g can vary as it gets far from the first portion 176a. For example, the size of the uneven patterns 176g can increase as it gets far from the first portion 176a, and the distance between the uneven patterns 176g can decrease as it gets far from the first portion 176a.

The uneven patterns 176g increase the contact area between the solution and the second bank 174 to thereby increase the adhesion and the friction force between the solution and the second bank 174 as compared with the first embodiment, and thus it can be further prevented that the solution dropped in the opening 176 is concentrated into the center of the display area DA.

At this time, since the uneven patterns 176g having the triangular shape has a vertex angle less than 90 degrees, the wetting property of the solution to the second bank 174 can be improved as compared with the uneven patterns 176e having the angulated rectangular shape of the third embodiment.

Meanwhile, the third portion 176f can be further disposed between the first portion 176a and the second portion 176b of the opening 176. The third portion 176f has a width that decreases from the first portion 176a to the second portion 176b. That is, the width of the third portion 176f adjacent to the first portion 176a is wider than the width of the third portion 176f adjacent to the second portion 176b. The third portion 176f can prevent the problem that the wetting property of the solution to the second bank 174 is lowered due to a sudden change between the widths of the first portion 176a and the second portion 176b.

Here, it is illustrated that corners of the uneven patterns 176g are angulated. However, the corners of the uneven patterns 176g can be rounded or curved, and in this case, the wetting property of the solution to the second bank 174 can be further improved.

Figure 10A:
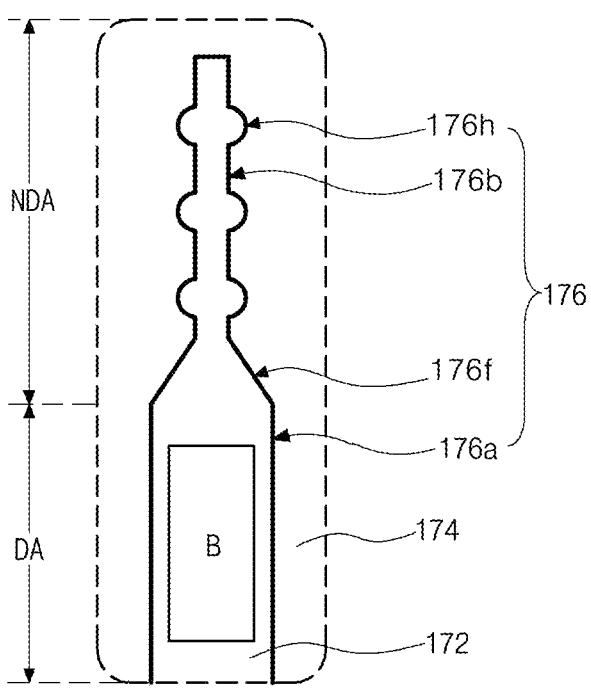
FIGS. 10A and 10B are schematically enlarged plan views of an electroluminescent display device according to a fifth embodiment of the present disclosure.
Figure 10B:
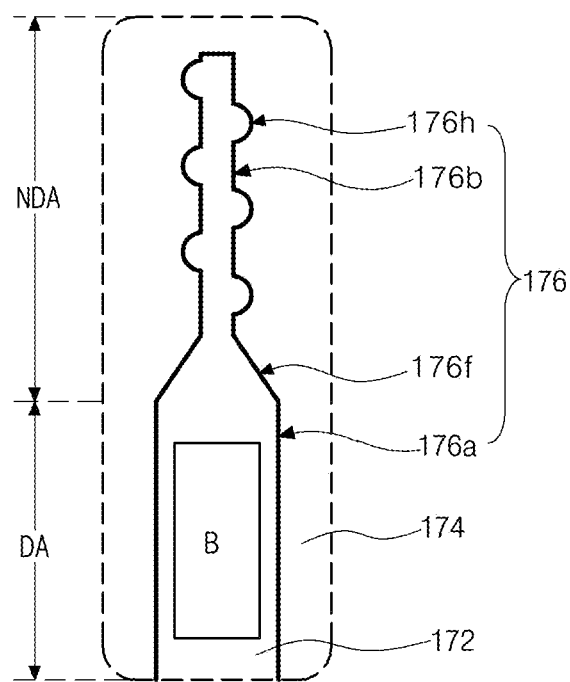

FIGS. 10A and 10B are schematically enlarged plan views of an electroluminescent display device according to a fifth embodiment of the present disclosure.

In FIGS. 10A and 10B, the second bank 174 has the opening 176 corresponding to the same color sub-pixel column, and the opening 176 includes the first portion 176a corresponding to the display area DA and the second portion 176b corresponding to the non-display area NDA.

The second portion 176b has the narrower width than the first portion 176a. Accordingly, the solution dropped in the opening 176 can be prevented from being concentrated into the center of the display area DA due to the capillary phenomenon.

Meanwhile, the second portion 176b has a plurality of uneven patterns 176h at each of first and second side surfaces facing each other along the first direction. Each of the uneven patterns 176h can be a protrusion having a semicircular shape.

As shown in FIG. 10A, the uneven patterns 176h can be disposed symmetrically to each other at the first and second side surface of the second portion 176b. Alternatively, as shown in FIG. 10B, the uneven patterns 176h can be disposed asymmetrically at the first and second side surface of the second portion 176b. That is, the uneven patterns 176h at the first side surface of the second portion 176b can alternate with the uneven patterns 176h at the second side surface of the second portion 176b.

The uneven patterns 176h can have the same size and the same distance therebetween. Alternatively, at least one of the size and the distance of the uneven patterns 176h can vary as it gets far from the first portion 176a. For example, the size of the uneven patterns 176h can increase as it gets far from the first portion 176a, and the distance between the uneven patterns 176h can decrease as it gets far from the first portion 176a.

The uneven patterns 176h increase the contact area between the solution and the second bank 174 to thereby increase the adhesion and the friction force between the solution and the second bank 174 as compared with the first embodiment, and thus it can be further prevented that the solution dropped in the opening 176 is concentrated into the center of the display area DA.

At this time, since the uneven patterns 176h having the semicircular shape is configured to be rounded or curved, the wetting property of the solution to the second bank 174 can be improved as compared with the uneven patterns 176e having the angulated rectangular shape of the third embodiment.

Meanwhile, the third portion 176f can be further disposed between the first portion 176a and the second portion 176b of the opening 176. The third portion 176f has a width that decreases from the first portion 176a to the second portion 176b. That is, the width of the third portion 176f adjacent to the first portion 176a is wider than the width of the third portion 176f adjacent to the second portion 176b. The third portion 176f can prevent the problem that the wetting property of the solution to the second bank 174 is lowered due to a sudden change between the widths of the first portion 176a and the second portion 176b.

Figure 11A:
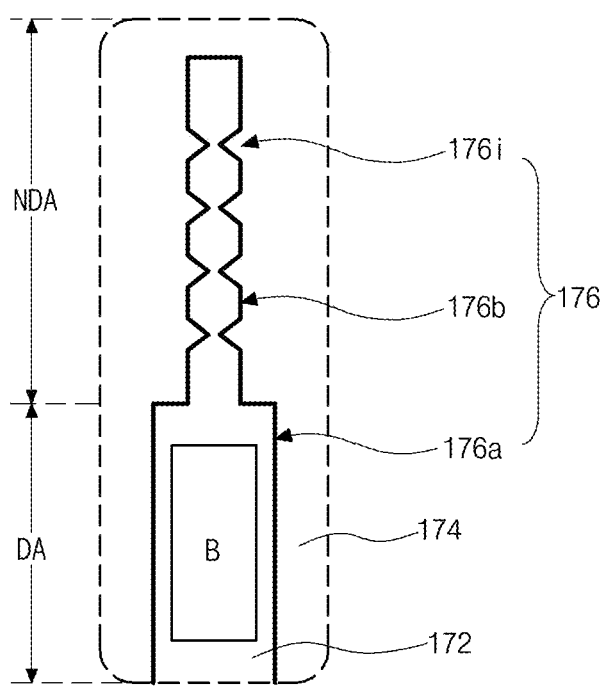
FIGS. 11A and 11B are schematically enlarged plan views of an electroluminescent display device according to a sixth embodiment of the present disclosure.
Figure 11B:
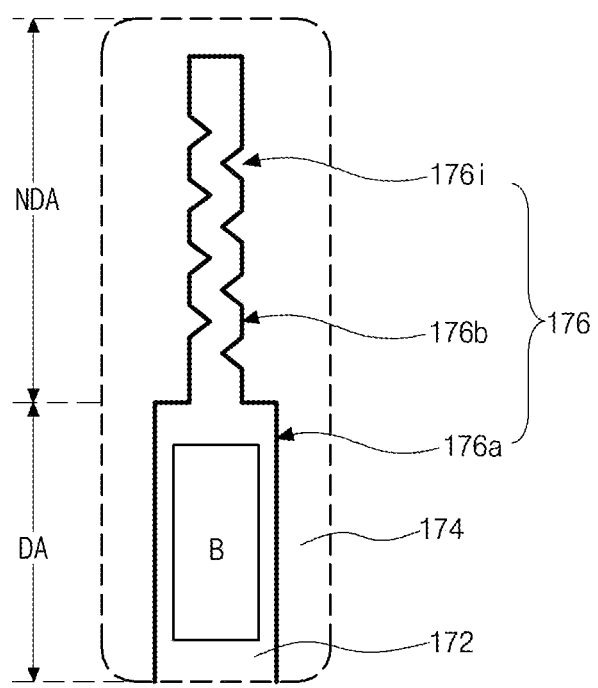

FIGS. 11A and 11B are schematically enlarged plan views of an electroluminescent display device according to a sixth embodiment of the present disclosure.

In FIGS. 11A and 11B, the second bank 174 has the opening 176 corresponding to the same color sub-pixel column, and the opening 176 includes the first portion 176a corresponding to the display area DA and the second portion 176b corresponding to the non-display area NDA.

The second portion 176b has the narrower width than the first portion 176a. Accordingly, the solution dropped in the opening 176 can be prevented from being concentrated into the center of the display area DA due to the capillary phenomenon.

Meanwhile, the second portion 176b has a plurality of uneven patterns 176i at each of first and second side surfaces facing each other along the first direction. Each of the uneven patterns 176i can be a depressed part having a triangular shape.

As shown in FIG. 11A, the uneven patterns 176i can be disposed symmetrically to each other at the first and second side surface of the second portion 176b. Alternatively, as shown in FIG. 11B, the uneven patterns 176i can be disposed asymmetrically at the first and second side surface of the second portion 176b. That is, the uneven patterns 176i at the first side surface of the second portion 176b can alternate with the uneven patterns 176i at the second side surface of the second portion 176b.

The uneven patterns 176i can have the same size and the same distance therebetween. Alternatively, at least one of the size and the distance of the uneven patterns 176*i* can vary as it gets far from the first portion 176*a*. For example, the size of the uneven patterns 176*i* can increase as it gets far from the first portion 176*a*, and the distance between the uneven patterns 176*i* can decrease as it gets far from the first portion 176*a*.

The uneven patterns 176*i* increase the contact area between the solution and the second bank 174 to thereby increase the adhesion and the friction force between the solution and the second bank 174 as compared with the first embodiment, and thus it can be further prevented that the solution dropped in the opening 176 is concentrated into the center of the display area DA.

Meanwhile, although not shown in the figures, the third portion can be further disposed between the first portion 176*a* and the second portion 176*b* of the opening 176. The third portion can have a width that decreases from the first portion 176*a* to the second portion 176*b*. That is, the width of the third portion adjacent to the first portion 176*a* can be wider than the width of the third portion adjacent to the second portion 176*b*. The third portion can prevent the problem that the wetting property of the solution to the second bank 174 is lowered due to a sudden change between the widths of the first portion 176*a* and the second portion 176*b*.

Here, it is illustrated that corners of the uneven patterns 176*i* are angulated. However, the corners of the uneven patterns 176*i* can be rounded or curved, and in this case, the wetting property of the solution to the second bank 174 can be further improved.

Meanwhile, the red, green and blue light-emitting diodes provided respectively at the red, green and blue sub-pixels are formed using light-emitting materials having different properties. Thus, the red, green and blue light-emitting diodes have different lifetimes and efficiencies, and the lifetime of the electroluminescent display device can be lowered by the difference in the lifetimes of the light-emitting diodes.

Accordingly, in the present disclosure, by differentiating the sizes of the red, green and blue sub-pixels, the lifetimes and efficiencies of the light-emitting diodes provided at respective sub-pixels can be optimized, thereby solving the problem of lowering the lifetime of the electroluminescent display device and thus improving the lifetime of the electroluminescent display device. For this, an electroluminescent display device according to a seventh embodiment of the present disclosure will be described with reference to FIGS. 12A and 12B.

Figure 12A:
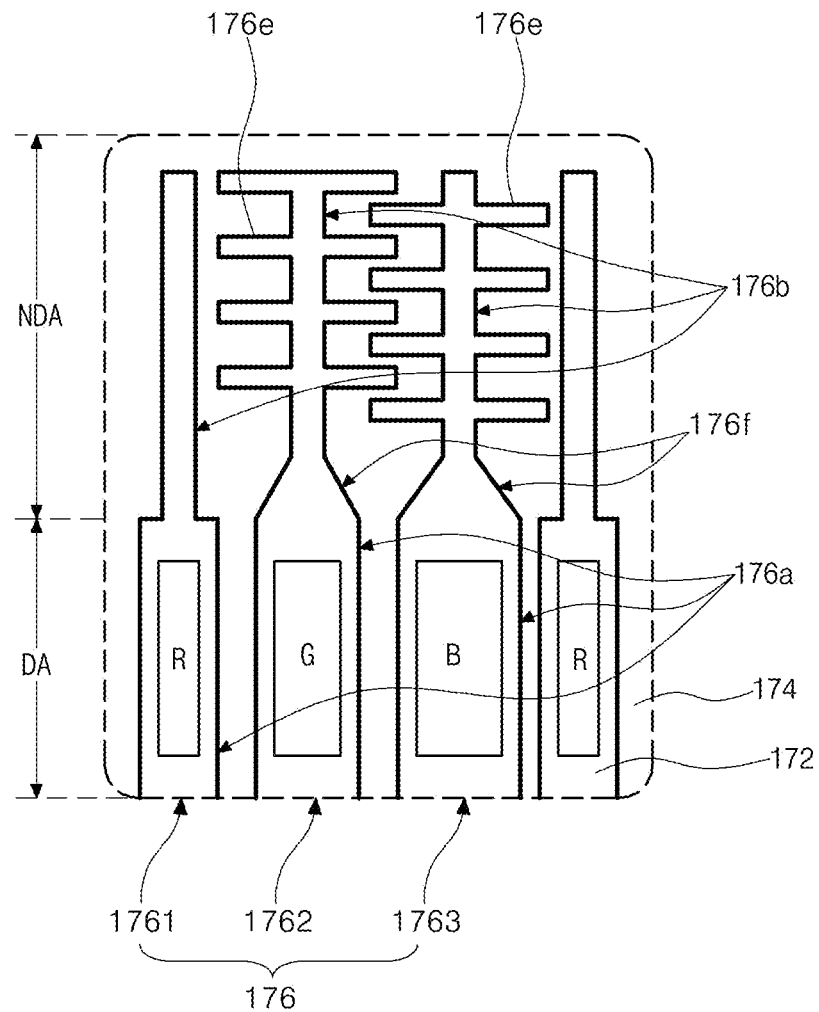
FIGS. 12A and 12B are schematically enlarged plan views of an electroluminescent display device according to a seventh embodiment of the present disclosure.
Figure 12B:
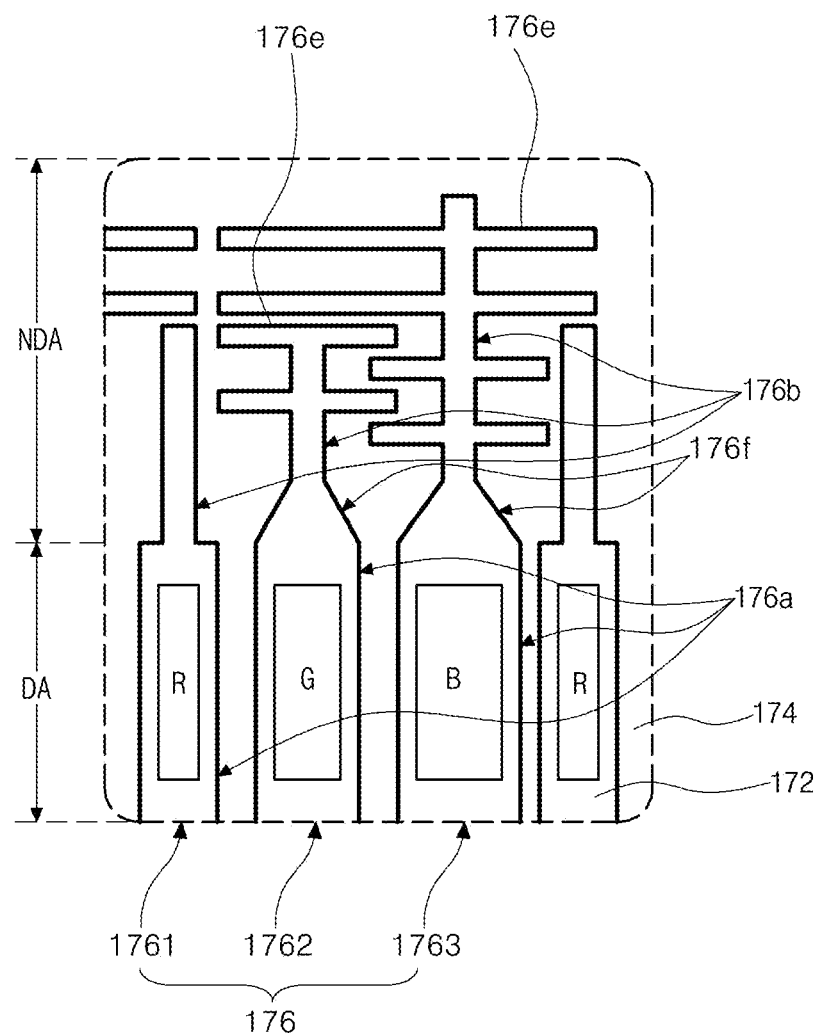

FIGS. 12A and 12B are schematically enlarged plan views of an electroluminescent display device according to a seventh embodiment of the present disclosure. The electroluminescent display device of the seventh embodiment has the same configuration as those of the above embodiments except for sizes of the sub-pixels and the second portion of the opening. The same parts as those of the above embodiments are designated by the same reference signs, and explanation for the same parts will be shortened or omitted.

As shown in FIGS. 12A and 12B, the red, green and blue sub-pixels R, G and B are sequentially disposed along the first direction in the display area DA. In addition, although not shown in the figures, the same color sub-pixels R, G and B are disposed along the second direction perpendicular to the first direction.

Here, the red, green and blue sub-pixels R, G and B have different sizes. The sizes of the red, green and blue sub-pixels R, G and B are determined by considering the lifetimes of the light-emitting diodes provided at respective sub-pixels. For example, the size of the green sub-pixel G may be larger than the size of the red sub-pixel R and smaller than the size of the blue sub-pixel B. At this time, the red, green and blue sub-pixels R, G and B can have the same length along the second direction and can have different widths along the first direction. The width of the green sub-pixel G can be larger than the width of the red sub-pixel R and smaller than the width of the blue sub-pixel B. However, the present disclosure is not limited thereto.

The red, green and blue sub-pixels R, G and B can be defined by the first and second banks 172 and 174.

More specifically, the first bank 172 is disposed between adjacent same color sub-pixels R, G and B and between adjacent different color sub-pixels R, G and B. The first bank 172 can surround each sub-pixel R, G and B.

Alternatively, the first bank 172 can be omitted between the adjacent different color sub-pixels R, G and B. That is, the first bank 172 can be formed only between the adjacent sub-pixels R, G and B arranged along the second direction and can extend in the first direction.

In addition, the first bank 172 is formed in the non-display area NDA. Alternatively, the first bank 172 can be removed in the non-display area NDA.

Next, the second bank 174 is formed on the first bank 172. The second bank 174 has the opening 176 corresponding to the same color sub-pixel column and is disposed between adjacent different color sub-pixels R, G and B arranged along the first direction.

Here, the opening 176 includes first, second and third openings 1761, 1762 and 1763 corresponding to the red, green and blue sub-pixels R, G and B, respectively.

The first, second and third openings 1761, 1762 and 1763 extend into the non-display area NDA. Accordingly, each of the first, second and third openings 1761, 1762 and 1763 includes the first portion 176*a* corresponding to the display area DA and the second portion 176*b* corresponding to the non-display area NDA.

The second portion 176*b* of each of the first, second and third openings 1761, 1762 and 1763 has a narrower width than the first portion 176*a*. Accordingly, the solution dropped in each of the first, second and third openings 1761, 1762 and 1763 can be prevented from being concentrated into the center of the display area DA due to the capillary phenomenon.

The first portions 176*a* of the first, second and third openings 1761, 1762 and 1763 have different widths. At this time, the second portions 176*b* of the first, second and third openings 1761, 1762 and 1763 can have the same width. Alternatively, the second portions 176*b* of the first, second and third openings 1761, 1762 and 1763 can have different widths. For example, the width of the second portion 176*b* of the second opening 1762 can be wider than the width of the second portion 176*b* of the first opening 1761 and narrower than the width of the second portion 176*b* of the third opening 1763.

Meanwhile, the second portions 176*b* of the first, second and third openings 1761, 1762 and 1763 can have different configurations.

For example, as shown in FIG. 12A, the second portions 176*b* of the first, second and third openings 1761, 1762 and 1763 can have the same length, and the second portions 176*b* of the second and third openings 1762 and 1763 can have the uneven patterns 176*e* at each of the first and second side surfaces facing each other along the first direction. The uneven patterns 176e of the second opening 1762 can be alternately disposed with the uneven patterns 176e of the third opening 1763.

In addition, each of the second and third openings 1762 and 1763 can further include the third portion 176f between the first portion 176a and the second portion 176b. The third portion 176f has a width that decreases from the first portion 176a to the second portion 176b. That is, the width of the third portion 176f adjacent to the first portion 176a is wider than the width of the third portion 176f adjacent to the second portion 176b.

Alternatively, as shown in FIG. 12B, the second portions 176b of the first and second openings 1761 and 1762 can have a shorter length than the second portion 176b of the third opening 1763, and the second portions 176b of the second and third openings 1762 and 1763 can have the uneven patterns 176e at each of the first and second side surfaces facing each other along the first direction. The uneven patterns 176e of the second opening 1762 are alternately disposed with some of the uneven patterns 176e of the third opening 1763.

At this time, others of the uneven patterns 176e of the third opening 1763 can have the larger length than the uneven patterns 176e of the second opening 1762 and some of the uneven patterns 176e of the third opening 1763.

The uneven patterns 176e of the second and third openings 1762 and 1763 increase the contact area between the solution and the second bank 174 to thereby increase the adhesion and the friction force between the solution and the second bank 174 as compared with the first embodiment, and thus it can be further prevented that the solution dropped in each of the second and third openings 1762 and 1763 is concentrated into the center of the display area DA. Here, in the first opening 1761 having the narrower width than the second and third openings 1762 and 1763, the solution is less concentrated into the center of the display area DA, and the first opening 1761 does not have the uneven patterns. However, the first opening 1761 can have the uneven patterns as occasion demands.

Meanwhile, in FIG. 12B, the others of the uneven patterns 176e of the third opening 1763 can be connected to the uneven patterns of the third opening adjacent thereto. Accordingly, in the second portion 176b of the third opening 1763, the saturation of the solution can increase in addition to the capillary phenomenon and the increase of the adhesion, and thus the solution dropped in the third opening 1763 can be even more prevented from being concentrated into the center of the display area DA.

In addition, each of the second and third openings 1762 and 1763 can further include the third portion 176f between the first portion 176a and the second portion 176b. The third portion 176f has a width that decreases from the first portion 176a to the second portion 176b. That is, the width of the third portion 176f adjacent to the first portion 176a is wider than the width of the third portion 176f adjacent to the second portion 176b. The third portion 176f can prevent the problem that the wetting property of the solution to the second bank 174 is lowered due to a sudden change between the widths of the first portion 176a and the second portion 176b.

In the present disclosure, by forming the light-emitting layer of each sub-pixel through the solution process, the fine metal mask can be omitted to thereby reduce the manufacturing costs, and a display device with a large size and high definition can be implemented.

In addition, the light-emitting layers of the same color sub-pixels are connected to each other and formed as one body, thereby reducing or minimizing the deviation in the dropping amount between nozzles and uniformly forming the thicknesses of the light-emitting layers of the sub-pixels. Therefore, the mura is prevented, thereby preventing the image quality of the display device from being lowered.

Moreover, the opening of the hydrophobic bank is configured to have a narrower width in the non-display area than in the display area, and the solution dropped in the opening can be prevented from being concentrated into the center of the display area, thereby preventing the problem that the light-emitting layer is not formed in edges of the display area.

Further, the opening of the hydrophobic bank has at least one uneven pattern in the non-display area, and the contact area between the solution and the hydrophobic bank in the non-display area increases to thereby increase the adhesion and the friction force between the solution and the hydrophobic bank. Accordingly, it can be further prevented that the solution dropped in the opening is concentrated into the center of the display area.

In addition, the red, green and blue sub-pixels are configured to have the different sizes, the lifetimes of the red, green and blue sub-pixels can be uniform. At this time, the openings of the hydrophobic bank corresponding to the red, green and blue sub-pixels are differently configured, and it can be prevented that the solutions corresponding to the red, green and blue sub-pixel rows are differently concentrated into the center of the display area due to the different sizes.

It will be apparent to those skilled in the art that various modifications and variations can be made in a device of the present disclosure without departing from the spirit or scope of the embodiments. Thus, it is intended that the present disclosure covers the modifications and variations of this invention provided they come within the scope of the appended claims and their equivalents.

What is claimed is:

1. An electroluminescent display device comprising:
a substrate on which a display area displaying an image and a non-display area disposed outside the display area are defined;
a plurality of sub-pixels disposed in the display area on the substrate and arranged along a first direction and a second direction;
a light-emitting diode disposed at each of the plurality of sub-pixels and including a first electrode, a light-emitting layer, and a second electrode;
a first bank disposed between adjacent sub-pixels arranged along the second direction and overlapping edges of the first electrode; and
a second bank disposed between adjacent sub-pixels arranged along the first direction and having an opening corresponding to a column of the sub-pixels arranged along the second direction,
wherein the opening includes a first portion corresponding to the display area and a second portion corresponding to the non-display area, and wherein a width of the second portion is narrower than a width of the first portion,
wherein the opening includes a first opening, a second opening, and a third opening corresponding to a first sub-pixel column, a second sub-pixel column, and a third sub-pixel column each including the sub-pixels arranged along the second direction, respectively,
wherein a width of the second sub-pixel column is larger than a width of the first sub-pixel column and smaller than a width of the third sub-pixel column along the first direction, wherein the second portions of the first opening, the second opening, and the third opening have different shapes, and wherein the second portions of the second opening and the third opening have uneven patterns, and the uneven patterns of the second portion of the second opening are alternately disposed with the uneven patterns of the second portion of the third opening.

2. The electroluminescent display device of claim 1, wherein the second portion includes at least one uneven pattern at each of a first side surface and a second side surface facing each other along the first direction.

3. The electroluminescent display device of claim 2, wherein the at least one uneven pattern at the first side surface and the second side surface are disposed symmetrically or asymmetrically.

4. The electroluminescent display device of claim 2, wherein the at least one uneven pattern has a rectangular shape, a triangular shape, or a semicircular shape.

5. The electroluminescent display device of claim 2, wherein the at least one uneven pattern is curved.

6. The electroluminescent display device of claim 2, wherein the opening further includes a third portion between the first portion and the second portion.

7. The electroluminescent display device of claim 6, wherein a width of the third portion decreases from the first portion to the second portion.

8. The electroluminescent display device of claim 1, wherein a length of the second portions of the first opening and the second opening is shorter than a length of the second portion of the third opening.

9. The electroluminescent display device of claim 1, wherein the first bank has a hydrophilic property and the second bank has a hydrophobic property.

10. The electroluminescent display device of claim 1, wherein the first bank and the second bank are formed as one body.

11. The electroluminescent display device of claim 1, wherein the first bank is formed between adjacent sub-pixels arranged along the first direction.

12. The electroluminescent display device of claim 1, wherein the light-emitting layers are formed on the first electrodes of the sub-pixels arranged along the second direction and on the first bank between the sub-pixels adjacent along the second direction to thereby form one body.

13. The electroluminescent display device of claim 1, further comprising at least one thin film transistor between the substrate and the first electrode, and the first electrode is connected to the at least one thin film transistor.

14. The electroluminescent display device of claim 1, wherein each sub-pixel has a first length along the second direction, the second portion has a second length along the second direction, and the second length is longer than the first length.

15. The electroluminescent display device of claim 14, wherein the second length is 5 times or more and 10 times or less than the first length.

* * * * *